United States Patent
Varanasi et al.

(10) Patent No.: US 7,084,789 B2
(45) Date of Patent: Aug. 1, 2006

(54) DC-FREE CODE HAVING LIMITED ERROR PROPAGATION AND LIMITED COMPLEXITY

(75) Inventors: Chandra C. Varanasi, Longmont, CO (US); Kinhing P. Tsang, Plymouth, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 79 days.

(21) Appl. No.: 10/715,077

(22) Filed: Nov. 17, 2003

(65) Prior Publication Data
US 2005/0104754 A1   May 19, 2005

(51) Int. Cl.
H03M 7/00 (2006.01)
H03M 5/00 (2006.01)

(52) U.S. Cl. .......................................... 341/59; 341/58
(58) Field of Classification Search ................... 341/59, 341/58, 102, 56; 375/242, 292, 286; 714/746, 714/761, 769, 792
See application file for complete search history.

(56) References Cited

U.S. PATENT DOCUMENTS

| | | | |
|---|---|---|---|
| 4,408,189 A * | 10/1983 | Betts et al. ................... 341/56 |
| 4,486,739 A | 12/1984 | Franaszek et al. ............ 341/59 |
| 4,675,650 A | 6/1987 | Coppersmith et al. ........ 341/58 |
| 4,888,779 A | 12/1989 | Karabed et al. ............. 714/792 |
| 5,022,051 A | 6/1991 | Crandall et al. ............. 375/292 |
| 5,095,484 A | 3/1992 | Karabed et al. ............. 714/746 |
| 5,151,699 A * | 9/1992 | Moriyama ................... 341/58 |
| 5,450,443 A * | 9/1995 | Siegel et al. ................ 375/286 |
| 5,646,950 A | 7/1997 | Varanasi et al. ............ 714/792 |
| 5,691,993 A | 11/1997 | Fredrickson ................. 714/761 |
| 5,742,243 A * | 4/1998 | Moriyama ................... 341/59 |
| 5,784,409 A * | 7/1998 | Coles ........................ 375/286 |
| 5,801,649 A | 9/1998 | Fredrickson ................. 341/58 |
| 6,188,337 B1 * | 2/2001 | Soljanin ...................... 341/59 |
| 6,343,101 B1 * | 1/2002 | Dong et al. ................. 375/242 |
| 6,356,215 B1 * | 3/2002 | Coene ........................ 341/102 |
| 6,366,223 B1 * | 4/2002 | Lee et al. ..................... 341/51 |
| 6,430,230 B1 * | 8/2002 | Cunningham et al. ....... 375/292 |
| 6,604,219 B1 * | 8/2003 | Lee et al. ................... 714/769 |
| 6,731,228 B1 * | 5/2004 | Lee et al. ..................... 341/58 |
| 6,778,105 B1 * | 8/2004 | Suh et al. ..................... 341/59 |
| 6,867,713 B1 * | 3/2005 | Tsang .......................... 341/58 |
| 6,903,667 B1 * | 6/2005 | Noda et al. .................. 341/58 |
| 6,961,010 B1 * | 11/2005 | Tsang .......................... 341/59 |

OTHER PUBLICATIONS

Kees A. Schouhamer Immink, Title: Codes For Digital Recorders, vol. No. 6 Oct. 1998, (pp. 40).

* cited by examiner

Primary Examiner—Patrick Wamsley
(74) Attorney, Agent, or Firm—Westman, Champlin & Kelly

(57) ABSTRACT

A method and apparatus are provided for encoding and decoding digital information. A sequence of data words is received, wherein each data word has a running digital sum (RDS). The sequence of data words is encoded into a sequence of corresponding code words, which has a current RDS. For each data word a binary symbol is added to the data word and the data word is selectively complemented as a function of the RDS of the data word and the current RDS of the sequence of code words to form the corresponding code word.

11 Claims, 4 Drawing Sheets

200
⬉
BEGIN
201 —— 1. Initialize R = 0.
202 —— 2. For I = 1:N (where $\underline{b}_{nN}$ is the final n-bit block in the data stream)
203 —— i. IF (R>0 and $R_i$>=0) or (R<0 and $R_i$<=0) complement the bits in $\underline{b}_{ni}$ and append a 1 to generate codeword $\underline{c}_i$.

ELSE IF (R<=0 and $R_i$>0) or (R>=0 and $R_i$<0) append a 0 to $\underline{b}_{ni}$ to generate codeword $\underline{c}_i$.
204 —— ii. Compute the RDS $r_i$ of $\underline{c}_i$.
205 —— iii. Update the sign of R by computing R+$r_i$.
206 —— 3. Concatenate all $\underline{c}_i$, i= 1, 2, ..., N to form the encoded sequence $\underline{c}$ for the bit string $\underline{b}$.
END

FIG. 2

300
⬉
BEGIN
301 —— For I = 1:N,
302 —— IF the $(n+1)^{st}$-bit of $\underline{c}_i$ = 0,
         Copy verbatim the first n bits of $\underline{c}_i$ to form $\underline{b}_{ni}$.
303 —— ELSE
         Complement the first n bits of $\underline{c}_i$ to form $\underline{b}_{ni}$.
         END
END

FIG. 3

DC-FREE CODE HAVING LIMITED ERROR PROPAGATION AND LIMITED COMPLEXITY

FIELD OF THE INVENTION

The present invention relates to communicating digital data through a communication channel. In particular, the present invention relates to encoding and decoding techniques for DC-free codes.

BACKGROUND OF THE INVENTION

In the field of digital communications, digital information is typically prepared for transmission through a channel by encoding it. The encoded data is then used to modulate a transmission to the channel. A transmission received from the channel is then demodulated and decoded to recover the original information.

Encoding the digital data serves to improve communication performance so that the transmitted signals are less corrupted by noise, fading, or other interference associated with the channel. The term "channel" can include media such as transmission lines, wireless communication and information storage devices such as magnetic disc drives. In the case of information storage devices, the signal is stored in the channel for a period of time before it is accessed or received. Encoding can reduce the probability of noise being introduced into a recovered digital signal when the encoding is adapted to the known characteristics of the data and its interaction with known noise characteristics of the channel.

In typical encoding arrangements, data words of m data bits are encoded into larger code words of n code bits, and the ratio m/n is known as the code rate of the encoder. In certain applications, such as in perpendicular recording within data storage systems, it is desirable for encoded channel sequences to have a spectral null at zero frequency. Such sequences are said to be DC-free or to have a DC content that is limited. Given a sequence of binary digits, if each binary digit "1" is translated into a plus one (+1) and each binary digit "0" is translated into a minus one (−1), the sequence will be DC-free if the running digital sum of the bipolar sequence is bounded. The running digital sum is the sum of all values (+1 and −1) in the bipolar sequence. When the variation of the running digital sum is kept to a small value, the sequence is known to have a tight bound. A tighter bound can improve the performance of the channel.

There is a need for DC-free codes that are amenable to practical implementations. It has been found that the mapping of binary input strings into code words having a bounded running digital sum tends to be complex. This complexity can result in considerable engineering effort being consumed to define the encoding and decoding rules and can require complex software or hardware to implement. A DC-free code is desired that has limited complexity and provides limited error propagation properties.

Various embodiments of the present invention address these problems, and offer other advantages over the prior art.

SUMMARY OF THE INVENTION

One embodiment of the present invention is directed to a method for encoding digital information. The method includes receiving a sequence of data words, wherein each data word has a running digital sum (RDS). The sequence of data words is then encoded into a sequence of corresponding code words, which has a current RDS. For each data word a binary symbol is added to the data word and the data word is selectively complemented as a function of the RDS of the data word and the current RDS of the sequence of code words to form the corresponding code word.

Another embodiment of the present invention is directed to an encoder for encoding digital information. The encoder includes an input for receiving a sequence of data words and encodes the sequence of data words into a sequence of successive code words, which has a current RDS. For each of the data words, the encoder adds a binary symbol to the data word and selectively complements the data word as a function of the RDS of the data word and the current RDS of the sequence of code words, to form the corresponding code word.

Another embodiment of the present invention is directed to a method of decoding digital information in a system. The method includes receiving a sequence of code words, wherein each code word has an encoded data word and an indicator bit. The sequence of successive code words is decoded into a sequence of successive data words according to a code in which the encoded data word is extracted unchanged into an uncoded user data word if the indicator bit has a first binary value and is extracted into the uncoded user data word and then complemented if the indicator bit has a second, opposite binary value.

Other features and benefits that characterize embodiments of the present invention will be apparent upon reading the following detailed description and review of the associated drawings.

BRIEF DESCRIPTION OF THE DRAWINGS

FIG. 2 is a diagram illustrating an encoding algorithm according to one embodiment of the present invention.

FIG. 3 is a diagram illustrating a decoding algorithm according to one embodiment of the present invention.

DETAILED DESCRIPTION OF ILLUSTRATIVE EMBODIMENTS

Embodiments of the present invention relate to a DC-free code for use in encoding and decoding digital data for transmission through communication channels with limited complexity and limited error propagation. The present invention can be used in any communication channel in which DC-free codes are useful, such as in data storage systems.

Figure 1:
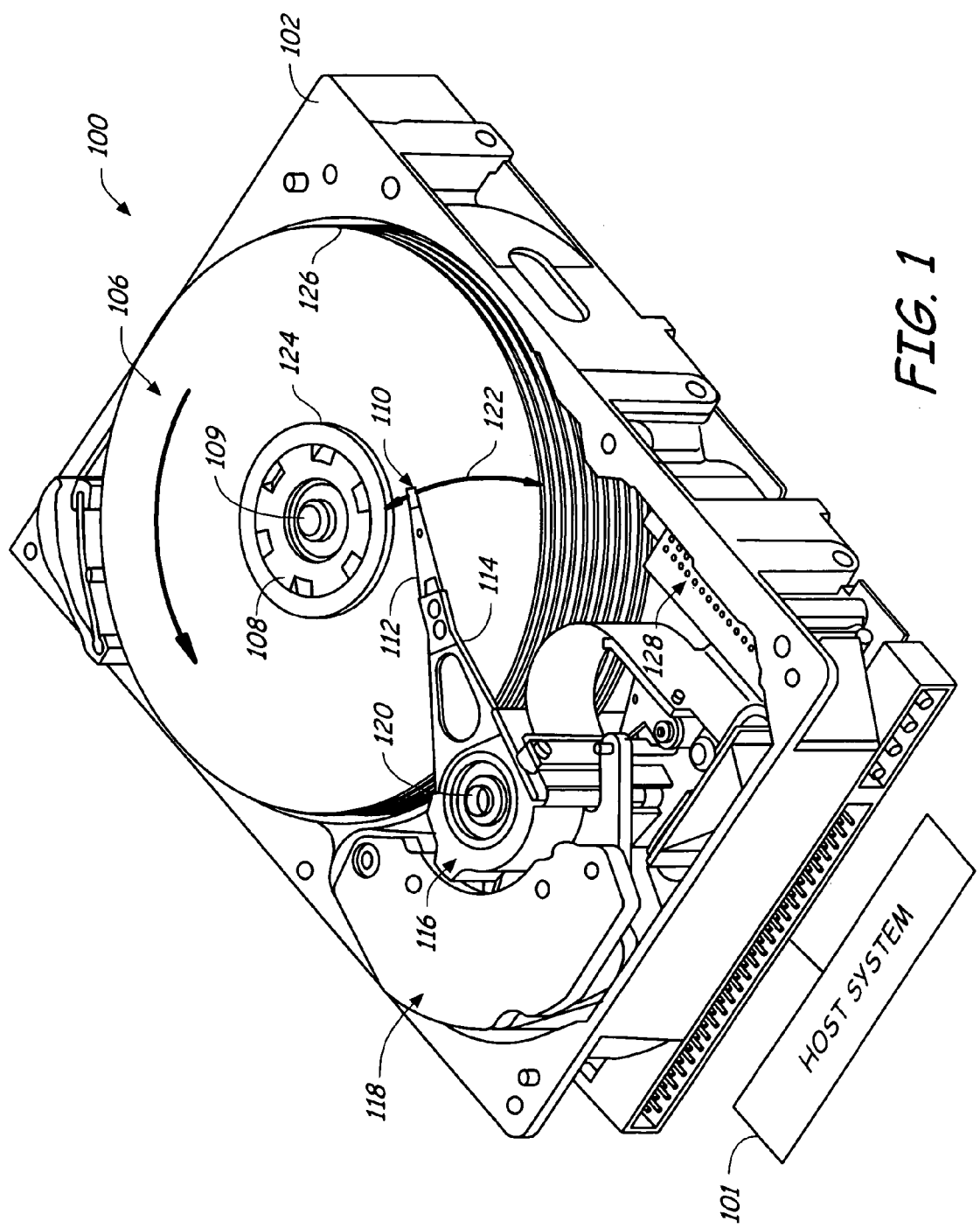
FIG. 1 is an isometric view of a disc drive in which one embodiment of the present invention is useful.

FIG. 1 is a perspective view of a magnetic disc drive 100, which forms apart of a communications channel in which one embodiment of the present invention is useful. Disc drive 100 communicates with a host system 101 and includes a housing with a base 102 and a top cover (not shown). Disc drive 100 further includes a disc pack 106, which is mounted on a spindle motor (not shown), by a disc clamp 108. Disc pack 106 includes a plurality of individual discs, which are mounted for co-rotation about central axis 109. Each disc surface has an associated head, which is mounted to disc drive 100 for communication with the disc surface. In the example shown in FIG. 1, heads 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached heads 110 about a pivot shaft 120 to position heads 110 over a desired data track along an arcuate patch 122 between a disc inner diameter 124 and a disc outer diameter 126. Voice coil motor 118 operates under control of internal (or external) circuitry 128.

The heads 110 and rotating disc pack 106 define a communications channel that can receive digital data and reproduce the digital data at a later time. In one embodiment, an encoder within internal circuitry 128 receives unconstrained user data, typically from a digital computer, and then encodes the data into successive code words according to a selected code. The encoded data is then used to modulate a write current provided to a write transducer in the head 110. The write transducer causes the modulated code words to be encoded on a magnetic layer in disc pack 106. At a later time, a read transducer in the head 110 recovers the successive modulated code words from the magnetic layer as a serial modulated read signal. Read circuitry within internal circuitry 128 demodulates the read signal into successive parallel code words. The demodulated code words are then decoded by a decoder within circuitry 128, which recovers the original user data for use by host system 101.

The read and write transducers in head 110 can be configured for longitudinal or perpendicular recording, for example. In longitudinal recording, a run length limited (RLL) code is typically used to encode the data. However, in perpendicular recording, it is desirable to use a DC-free code or a code in which the DC content is limited. Traditionally, the mapping for DC-free codes has been complex. Thus, the problem of designing DC-free codes that are amenable to implementation is of practical significance.

1. The Encoding Algorithm

In one embodiment of the present invention, the encoding algorithm parses a given binary sequence of uncoded user data b into smaller length sub-blocks of length n, where n is an arbitrary but fixed integer. For example, if $b=b_1b_2 b_3 \ldots$ is the binary string of user data, then the first n-bit block is $b_{n1}=b_1b_2 b_3 \ldots b_n$, the second n-bit block is $b_{n2}=b_{n+1}b_{n+2} \ldots b_{2n}$, the third n-bit block is $b_{n3}=b_{2n+1} b_{2n+2} \ldots b_{3n}$, etc. The encoding algorithm then encodes the n-bit sub-blocks into (n+1)-bit code words and concatenates the (n+1)-bit code words to form an encoded string c for the uncoded binary sequence b such that the absolute running digital sum (RDS) of c (n+1). Since the encoding algorithm encodes n-bit sub-blocks into (n+1)-bit code words, the encoder has a code rate of n/(n+1) for a given positive integer n.

The RDS of a binary string can be defined as follows. Given a bit string $a=a_1a_2 \ldots a_n$ of length n, a corresponding bipolar string $A=A_1A_2 \ldots A_n$ can be obtained by replacing all "0's" in b by "−1". The RDS of A is the algebraic sum of $A_1A_2 \ldots A_n$. For example, if a=1001001, then A=1−1 −1 1 −1−1 1, and the RDS of A=−1. If a given binary string $a_1a_2 \ldots a_n$ is to be DC-free, it is necessary for its RDS to be bounded. A bounded RDS ensures that the bit string a is DC-free.

FIG. 2 is a diagram illustrating pseudocode for an encoding algorithm 200 according to one embodiment of the present invention. Let $R_1$, $R_2$, $R_3$, etc. be the RDS values for $b_{n1}$, $b_{n2}$, $b_{n3}$, etc., repsectively. $R_i$ is the RDS value for the $i^{th}$ n-bit block $b_{ni}$. Let R be the current RDS of the encoded bit stream c.

At step 201, R is initialized to 0. At step 202, a loop begins, which is performed once for each n-bit block, $b_{n1},b_{n2} \ldots b_{nN}$, where $b_{nN}$ is the final n-bit block in the user data stream. The loop includes steps 203–205.

At step 203, if the current RDS of chas the same sign as the RDS of the current n-bit block $b_{ni}$ (e.g., if (R>0 and $R_i$ is $\geq 0$) or (R<0 and $R_i$ is $\leq 0$)), then the encoding algorithm complements the bits in $b_{ni}$ and appends a binary "1" to the complemented bits to generate a corresponding code word $c_i$. Equivalently, a binary "0" can be appended to the bits in block $b_{ni}$ and then all bits are complemented to form the code word $c_i$. In one embodiment, the binary "1" is appended to the end of the code word $c_i$. However, this bit can be appended at any bit location within code word $c_i$.

However if the current RDS of c has a different sign as the RDS of the current n-bit block $b_{ni}$ (e.g., if ($R \leq 0$ and $R_i>0$) or if ($R \geq 0$ and $R_i<0$)), a "0" is appended to $b_{bni}$ to generate the code word $c_i$. In this case, the bits in $b_{ni}$ are unchanged. The values of R=0 and $R_i=0$ can be regarded as negative RDS values (as in the embodiment shown here) or as a positive value in alternative embodiments of the present invention.

At step 204, the algorithm computes the running digital sum $r_i$ of code word $c_i$. At step 205, the encoding algorithm updates the sign of R by computing $R=R+r_i$.

At step 206, the algorithm concatenates all code words $c_i$, for i=1, 2, ... N to form the code word sequence c for the bit string b.

The encoding algorithm shown in FIG. 2 results in the absolute RDS of the code word sequence c being bounded by (n+1), which guarantees the DC-free property for the coded sequence. This property can be shown as follows. For $m \geq 1$, let $r_m$ denote the RDS of code word $c_m$. Then, $$\text{Let } r_{acc}(i) = \sum_{m=1}^{i} r_n \qquad \text{Eq. 1}$$

where $r_{acc}(i)$ is the accumulated RDS for the first i coded blocks $c_i$ of (n+1) bits each. For each n-bit data word w, the encoder assigns a pair of (n+1)-bit code words: a unique (n+1)-bit code word cw formed by appending a "0" to w, and its complement cw'. Since the number of (n+1)-bit code words ($2^{n+1}$) is twice the number of n-bit words ($2^n$), there are enough (n+1)-bit code words to make such an assignment possible. Also, since any two n-bit words differ in at least one bit, their corresponding (n+1)-bit code words also differ in at least one bit, which ensures that the complements of these code words are also different. The RDS(cw)=−RDS(cw'). For any i≧1, the specific code word that is choosen for the $(i+1)^{th}$ n-bit word w in encoding the bit stream b depends on the value of $r_{acc}(i)$. The algorithm chooses cw or cw' for w based on which choice results in smaller value for $|r_{acc}(i+1)|$. This construction ensures that the RDS of c is bounded.

If the same n-bit word repeats itself in b, it results in an unbounded RDS for b. However, the |RDS| of the code word sequence c for this data pattern does not exceed (n+1) because of the way the encoding algorithm works. Similarly, if an n-bit pattern and its complement keep occurring in tandem in the incoming data stream, the RDS of the encoded sequence keeps increasing until it reaches n in one direction (positive or negative), then crosses zero, and changes direction. Thus, the absolute value of RDS is always bounded by (n+1), which guarantees the DC-free property for the coded sequence.

2. The Decoding Algorithm

FIG. 3 is a diagram illustrating pseudocode for the decoding algorithm according to one embodiment of the present invention. Since the encoding algorithm simply appends a "0" to the n-bit data word $b_{ni}$ or appends a "1" to the complemented data word, the decoding algorithm can decode the code word $c_i$ by simply examining the $(n+1)^{st}$ indicator bit.

Decoding algorithm 300 includes steps 301–303. At step 301, the decoding algorithm begins a loop for decoding each successive (n+1)-bit code word $c_i$, for i=1, 2, . . . N. Again, N is an integer variable representing the number of code words $c_i$ in the encoded sequence c. At step 302, for each code word $c_i$, if the $(n+1)^{st}$ bit (i.e., the indicator bit) of $c_i$=0, then the decoding algorithm copies verbatim the first n bits of $c_i$ to form $b_{ni}$. If not, the first n bits of $c_i$ are complemented to form $b_{ni}$, at step 303.

The decoding algorithm shown in FIG. 3 assumes that the appended indicator bit is located at the end of each (n+1)-bit code word $c_i$. However, the decoding algorithm can be easily modified to look at any bit position to which the indicator bit was appended by the encoding algorithm.

3. Addition of Parity Bits and k-Constraint

In an alternative embodiment, one or more parity bits can be added to each code word. The addition of one parity bit, in the worst case, could increase the absolute value of the running digital sum of the encoded sequence at the end of the code word to (n+2). In a run-length-limited (RLL) code, the number of consecutive zero's is constrained to a value no greater than a maximum number "k". With the above encoding algorithm, the worst-case k-constraint will be no more than (n+2). An encoded sequence having the maximum number of consecutive zeros equal to the worst-case k-constraint could occur if the incoming user data stream includes a repetition of n-bit word and its complement in tandem.

4. Example of Encoding and Decoding with a Rate ¾ DC-Free Code

Table 1 illustrates the mapping of n-bit user data words into (n+1)-bit code words, where n=3, using the above algorithm.

TABLE 1

| 3-BIT DATA WORD | THE TWO POSSIBLE 4-BIT CHOICES FOR ENCODING THE THREE-BIT DATA WORD |
|---|---|
| 000 | 0000 |
|  | 1111 |
| 001 | 0010 |
|  | 1101 |
| 010 | 0100 |
|  | 1011 |
| 011 | 0110 |
|  | 1001 |
| 100 | 1000 |
|  | 0111 |
| 101 | 1010 |
|  | 0101 |
| 110 | 1100 |
|  | 0011 |
| 111 | 1110 |
|  | 0001 |

Consider a string b=010 010 111 000 001 101 011 001. Table 2 summarizes the encoding procedure for b, given the mapping in Table 1.

TABLE 2

| PRESENT 3-BIT BLOCK IN b | RDS OF THE PRESENT THREE-BIT BLOCK IN b | ACCUMULATED RDS R FOR THE CODE WORD STREAM BEFORE ENCODING THE PRESENT 3-BIT BLOCK | CODEWORD $c_i$ FOR THE PRESENT 3-BIT BLOCK IN b | RDS $r_i$ OF INDIVIDUAL $C_i$. | ACCUMULATED RDS FOR THE CODE WORD STREAM AFTER ENCODING THE PRESENT 3-BIT BLOCK ($R + r_i$) |
|---|---|---|---|---|---|
| 010 | −1 | 0 | 0100 | −2 | −2 |
| 010 | −1 | −2 | 1011 | 2 | 0 |
| 111 | 3 | 0 | 1110 | 2 | 2 |
| 000 | −3 | 2 | 0000 | −4 | −2 |
| 001 | −1 | −2 | 1101 | 2 | 0 |
| 101 | 1 | 0 | 1010 | 0 | 0 |
| 011 | 1 | 0 | 0110 | 0 | 0 |
| 001 | −1 | 0 | 1101 | 2 | 2 |

The encoding algorithm obtains c by joining together all $c_i$. Thus c=0100101111100000110110100110101. When encoding each three-bit data word in b the encoding algorithm attempts to minimize the accumulated RDS for the code word stream constructed up to that point.

When decoding the code word sequence c, the decoding algorithm parses the code word sequence into four-bit code words and examines the $4^{th}$ bit in each code word. If the $4^{th}$ bit is a "0", the first three bits of the code word are extracted as the decoded three-bit user data word for that code word. If the $4^{th}$ bit is a "1", the first 3 bits in the code word are complemented to generate the decoded 3-bit user data word for that code word. The decoding algorithm joins together all the decoded 3-bit user data words to generate the decoded user data string b. Table 3 summarizes the operation of the decoding algorithm on the code word string c.

TABLE 3

| 4-BIT BLOCKS IN c | DECODED 3-BIT DATA WORD |
|---|---|
| 0100 | 010 |
| 1011 | 010 |
| 1110 | 111 |
| 0000 | 000 |
| 1101 | 001 |
| 1010 | 101 |
| 0110 | 011 |
| 1101 | 001 |

By joining together all the decoded 3-bit blocks in the second column of Table 3, the decoding algorithm obtains the decoded user data string b as 010 010 111 000 001 101 011 001, which is the same as the uncoded bit string from which the code word string c was generated in Table 2.

5. Flow Chart of the Encoder

Figure 4:
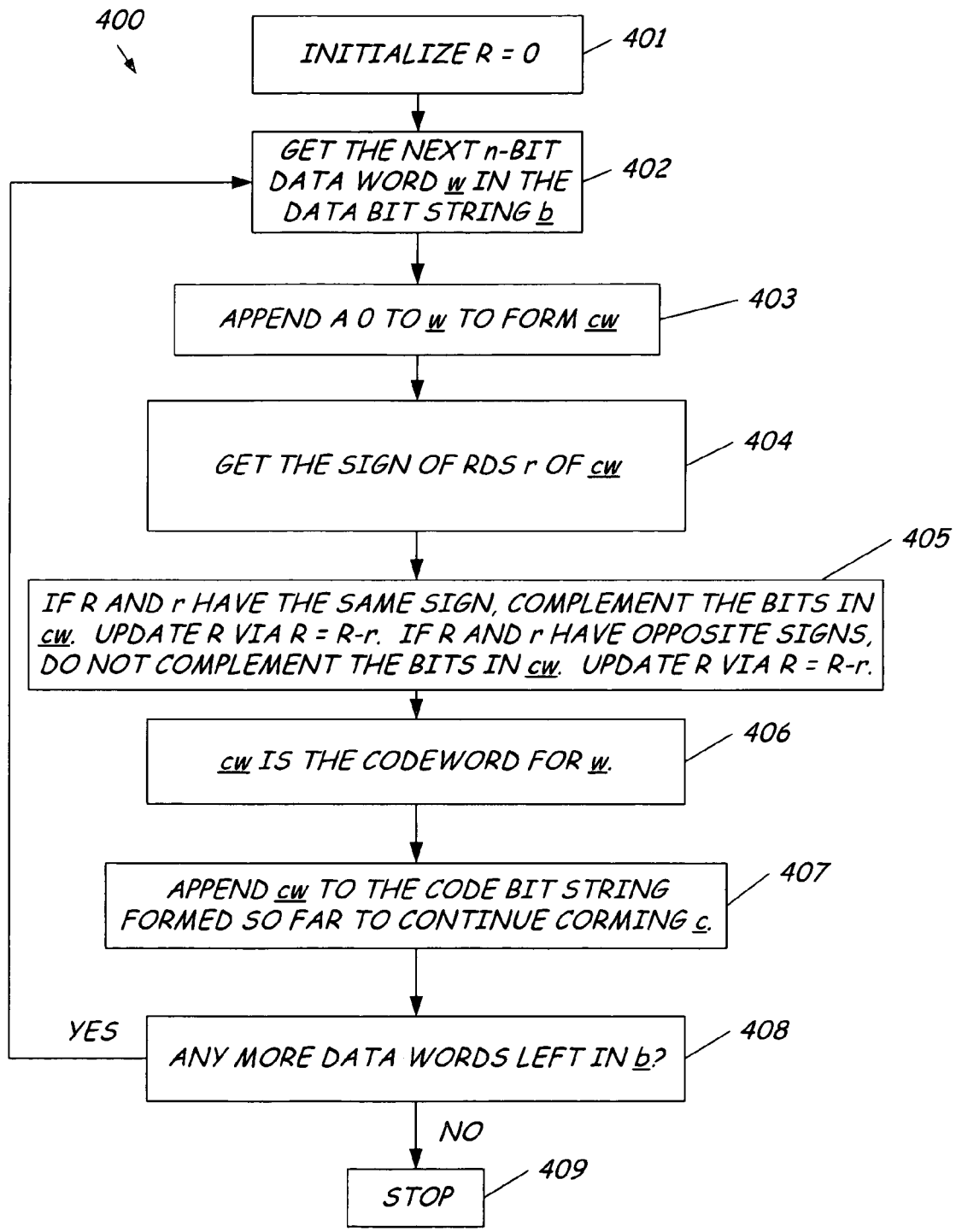
FIG. 4 is a flow chart illustrating an encoding algorithm according to one embodiment of the present invention.

FIG. 4 is a flowchart illustrating the steps performed by the encoding algorithm according to one embodiment of the present invention. At step 401, the current RDS variable "R" for the encoded sequence c is initialized to zero. At step 402, the encoder gets the next n-bit data word w in the uncoded user data bit string k. The encoder then appends a "0" to w to form cw at step 403. At step 404, the algorithm computes the sign of RDS "r" of cw.

At step 405, if R and r have the same sign, the algorithm complements the bits in the code word cw and updates R to equal R−r. This is equivalent to comparing the sign of $b_{ni}$ with the sign of R in step 203 in FIG. 2. In either case, the value of R is moved toward zero. If R and r have opposite signs, the algorithm does not complement the bits in cw and updates R to equal R+r. The value of cw becomes the code word for w at step 406. The code word cw is then appended to the code bit string formed so far to continue forming code word sequence c at step 407.

At step 408, if there are any more n-bit data words left in the user data bit string b, the algorithm returns to step 402 to encode the next data word. If not, the algorithm terminates at step 409.

6. Flow Chart of the Decoder

Figure 5:
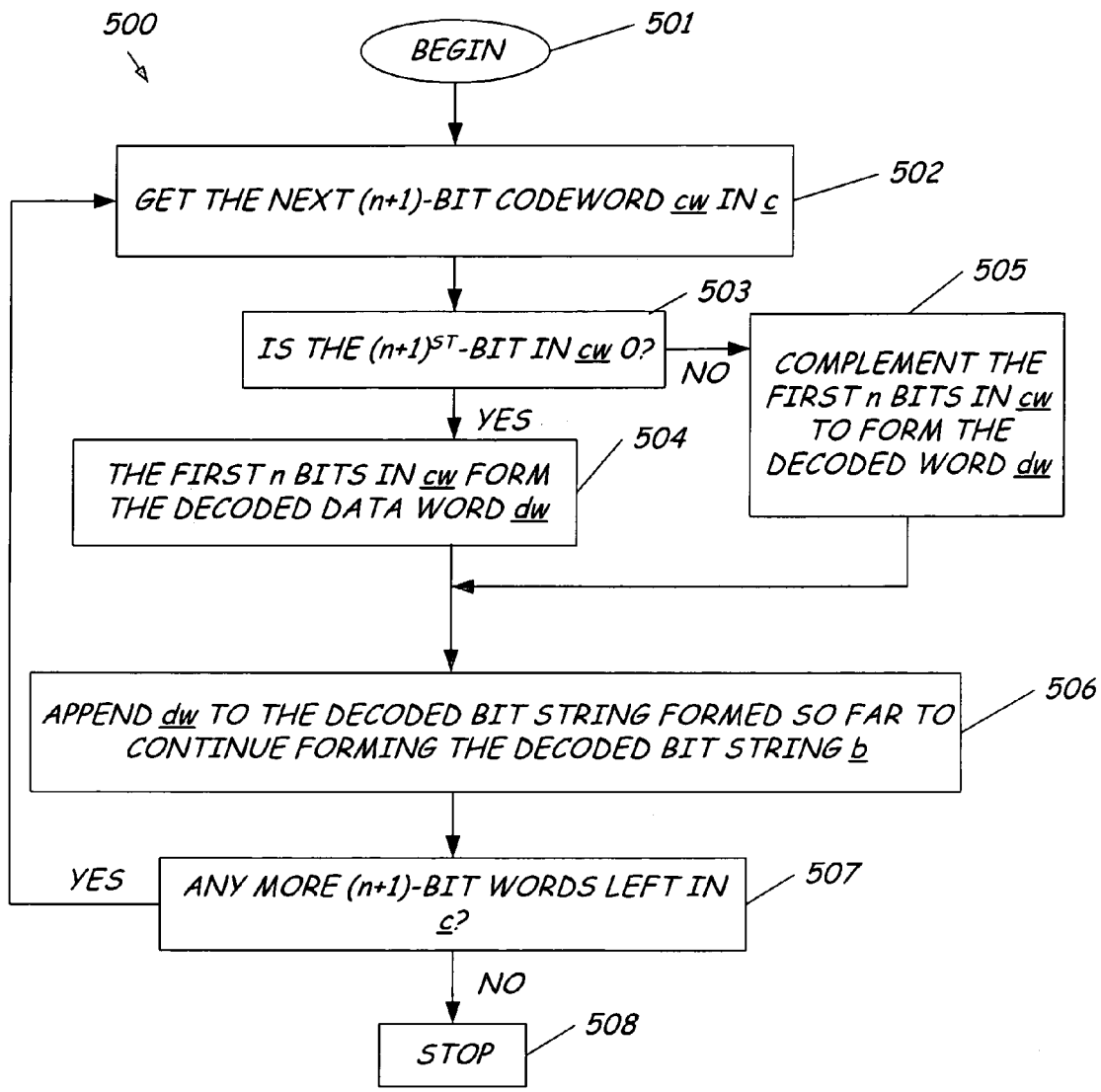
FIG. 5 is a flow chart illustrating a decoding algorithm according to one embodiment of the present invention.

FIG. 5 is a flowchart illustrating the steps performed by decoding algorithm 500 according to one embodiment of the present invention. The decoding algorithm begins at step 501. At step 502, the decoding algorithm gets the next (n+1)-bit code word cw in code word sequence c. If the $(n+1)^{st}$ bit in code word cw is "0", at step 503, the decoding algorithm extracts the first n bits in cw to form the decoded user data word dw at step 504. If not, the decoding algorithm complements the first n bits in cw to form the decoded user data word dw, at step 505. At step 506, the decoding algorithm appends the decoded user data word dw to the decoded bit string formed so far to continue forming the decoded bit stream b, at step 506. At step 507, if there are any more (n+1)-bit code words left in the code word sequence c, the decoding algorithm returns to step 502 to decode another code word cw. If not, the decoding algorithm terminates at step 508.

As long as the indicator bit (e.g., the appended $(n+1)^{th}$ bit in the generated code word) is not corrupted, a single bit error in the code word results in a single bit error in data word. In general, "m" erroneous bits in the code word result in exactly "m" erroneous decoded bits. This corresponds to the least possible error propagation any decoder can expect to achieve. This benefit is achieved because the encoder mapping rules are simply a verbatim copying of the n-bit data word or its complement. The simpler the encoder's mapping rules, the lower the decoder's error propagation property. The simplest mapping rule that can be achieved for an encoder is to copy the data word itself as the code word. Another practical advantage of the encoding algorithm discussed above is its ease of implementation. The encoder and decoder mapping rules are not ad hoc as in other encoder-decoder mapping rules. Considerable engineering effort is often spent in coming up with the encoding-decoding rules. As mentioned above, the encoder mapping rule discussed above is simply the appending of one bit to the data word, and the decoder mapping rule is simply the copying or complementing of the first n bits of the code words. Thus, implementation of the code rules is relatively straightforward.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the communication system while maintaining substantially the same functionality without departing from the scope and spirit of the present invention. In addition, although the embodiments described herein are directed to a coding system for a disc drive, it will be appreciated by those skilled in the art that the teachings of the present invention can be applied to any communication channel in which DC-free codes are useful, such as satellite communications and telecommunications, without departing from the scope and spirit of the present invention. Also, a digital "word" or "block" can have any number of bits in alternative embodiments of the present invention. In addition, computing the RDS of a given data word is considered equivalent to computing the RDS of the corresponding code word when the comparison is made to the running RDS of the code word sequence the RDS of the code word is a function of the RDS of the data word and a similar effect is achieved.

What is claimed is:

1. A method of encoding digital information in a system, the method comprising:
   (a) receiving a sequence of data words, wherein each data word has a running digital sum (RDS); and
   (b) encoding the sequence of data words into a sequence of corresponding code words, which has a current RDS, wherein encoding comprises for each data word, adding a binary symbol to the data word and forming the corresponding code word by:
      (b)(1) mapping the data word unchanged into the corresponding code word if a sign of the RDS of the data word is different than a sign of the current RDS of the sequence of code words; and
      (b)(2) complementing the data word if the sign of the RDS of the data word is the same as the sign of the current RDS of the sequence of code words.

2. The method of claim 1 wherein (b)(2) comprises complementing the binary symbol with the data word.

3. The method of claim 2 wherein (b)(1) comprises mapping the data word and the binary symbol unchanged into the corresponding code word if the sign of the RDS of the data word is different than the sign of the current RDS of the sequence of code words.

4. The method of claim 1 and further comprising:
   (c) updating the current RDS of the sequence of code words after forming the corresponding code word for one of the data words and before encoding the next data word in the sequence of data words; and
   (d) concatenating the corresponding code word to the sequence of code words.

5. The method of claim 1 wherein adding a binary symbol to the data word comprises adding a binary "0" to the data word in (b)(1) and adding a binary "1" to the data word in (b)(2).

6. The method of claim 1 wherein:
   (a) comprises parsing the sequence of data words into n-bit data words; and
   (b) comprises encoding the sequence of n-bit data words into a sequence of corresponding (n+1)-bit code words such that the current R/DS remains less than or equal to n+1.

7. An encoder for encoding digital information, the encoder comprising:
   an input for receiving a sequence of data words, wherein each data word has a running digital sum (RDS); and
   encoding means for encoding the sequence of data words into a sequence of successive code words, which has a current RDS, wherein for each of the data words, the encoding means adds a binary symbol to the data word and forms the corresponding code word by mapping the data word unchanged into the corresponding code word if a sign of the RDS of the data word is different than a sign of the current RDS of the sequence of code words, and by complementing the data word if the sign of the RDS of the data word is the same as the sign of the current RDS of the sequence of code words.

8. The encoder of claim 7 wherein the encoding means further comprises:
   means for updating the current RDS of the sequence of code words after forming the corresponding code word for one of the data words and before encoding the next data word in the sequence of data words; and
   means for concatenating the corresponding code word to the sequence of code words.

9. The encoder of claim 7 wherein the binary symbol added to the data word by the encoding means has a binary "0" state if the sign of the RDS of the data word is different than the sign of the current RDS of the sequence of code words and has a binary "1" state if the sign of the RDS of the data word is the same as the sign of the current RDS of the sequence of code words.

10. The encoder of claim 7 wherein the encoding means selectively complements the binary symbol with the data word as a function of the RDS of the data word and the current RDS of the sequence of code words, to form the corresponding code word.

11. The encoder of claim 7 wherein the encoding means parses the sequence of data words into n-bit data words and encodes the sequence of n-bit data words into a sequence of corresponding (n+1)-bit code words such that the current RDS remains less than or equal to n+1.

* * * * *